US005966588A

United States Patent [19]
Ju et al.

[11] Patent Number: 5,966,588

[45] Date of Patent: Oct. 12, 1999

[54] FIELD EMISSION DISPLAY DEVICE FABRICATION METHOD

[75] Inventors: Byeong Kwon Ju, Kyungki-Do; Myung Hwan Oh, Seoul; Yun Hi Lee, Kyungki-Do; Nam Yang Lee, Seoul, all of Rep. of Korea

[73] Assignee: Korea Institute of Science and Technology, Seoul, Rep. of Korea

[21] Appl. No.: 08/627,533

[22] Filed: Apr. 4, 1996

[30] Foreign Application Priority Data

Jul. 10, 1995 [KR] Rep. of Korea ...................... 95/20245

[51] Int. Cl.$^6$ ....................... H01L 21/00; H01L 21/4763; H01J 1/16; H01J 9/04

[52] U.S. Cl. ............................ 438/20; 438/978; 313/336; 445/50; 445/51; 378/122

[58] Field of Search ..................... 438/20, 978; 313/336; 445/50, 51; 378/122; 148/DIG. 12; 216/11

[56] References Cited

U.S. PATENT DOCUMENTS

| | | | |
|---|---|---|---|
| 4,307,507 | 12/1981 | Gray et al. | 438/20 |
| 5,100,355 | 3/1992 | Marcus et al. | 445/50 |
| 5,169,472 | 12/1992 | Goebel | 148/DIG. 12 |
| 5,334,908 | 8/1994 | Zimmerman | 313/336 |
| 5,499,938 | 3/1996 | Nakamoto et al. | 445/50 |
| 5,599,749 | 2/1997 | Hattori | 438/20 |
| 5,666,024 | 9/1997 | Vickers | 313/336 |

OTHER PUBLICATIONS

Sokolich et al., Field Emission From Submicron Emitter Arrays, IEDM (International Electron Devices Meeting) Technical Digest, pp. 159–162 (1990).

Nakamoto et al., "Fabrication of Gated Field Emitter Arrays by Transfer Mold Technique", Revue "Le Vide, les Couches Mines"–Supplement au N°271–Mars–Pvril, p. 4144 (1994).

*Primary Examiner*—Olik Chaudhuri
*Assistant Examiner*—Alonzo Chambliss
*Attorney, Agent, or Firm*—Townsend and Townsend and Crew LLP

[57] ABSTRACT

An improved field emission display device fabrication method which adopts both a silicon wafer direct bonding method and a mold method so as to fabricate an improved field emission display device, which includes the steps of a first step which forms a tip array by a molding method; and a second step which bonds the tip array to a second semiconductor substrate.

22 Claims, 5 Drawing Sheets

FIELD EMISSION DISPLAY DEVICE FABRICATION METHOD

BACKGROUND OF THE INVENTION

1. Field of the Invention

The present invention relates to a field emission display device fabrication method, and particularly to an improved field emission display device fabrication method of fabricating an improved field emission display device in a silicon wafer direct bonding method and a mold method.

2. Description of the Conventional Art

Generally, a field emission display device fabrication method is classified into a metal tip vacuum evaporation method of C. A. Spindt which is directed to using a pin hole mask and a silicon tip method of H. F. Gray, which is directed to forming layers by a silicon etching.

In addition, the field emission display device fabrication method is classified into a method of using a metal tip and a method of using a silicon tip in accordance with the tip material used so as to fabricate the field emission display device. In this case, each has its inherent disadvantage.

That is, the method of using a metal tip as a field emission display device material has an advantage in that it has good physical and chemical durabilities as well as has a relatively high field emitting current density; however, it is somehow difficult to precisely control fabrication conditions such as a precise diameter at one end of the tip and the height of the tip. In addition, the method of using a silicon tip as a field emission display device material has an advantage in that it can prevent a thermal mismatch because the tip and the substrate are made of the same material when forming a tip on a silicon substrate, the fabrication steps thereof are compatible to the existing VLSI steps, and desired configurations of the product can be achieved more easily; however, in this case, the physical and chemical durabilities of the product are weak compared with using a metal material, and it is difficult to achieve a desired field emitting current level.

In 1981, H. F. Gray et, al. introduced a mold technique so as to more easily fabricate a tip having a good uniformity and a geometrical characteristic. In addition, in 1990, M. Sokolich et al disclosed an improved field emission display device fabrication method of emitting an electron field at a lower current level of about 10V.

In addition, 1993 and 1994, M. Nakamoto et al. (Revue "Le Vide, les Couches Minces"—Supplément au N°271-Mars-Pvril 1994, pp.41–44) introduced a transfer mold technique which is characterized to forming a field emission display device on a glass substrate, while performing a thin film deposition process and a photo etching process at the same time after transferring a tip array formed by the above-mentioned technique on a glass substrate.

Referring to FIGS. 1A through 1E, the above-mentioned conventional field emission display device fabrication methods will now be explained.

To begin with, the method of M. Sokolich et. al., (IEDM (International Electron Devices Meeting) Technical Digest, pp.159–162 (1990)) is directed to depositing an insulating layer on a silicon wafer 1, and patterning by a photo etching process so as to form an insulation film pattern 2 as shown in FIG. 1A.

Thereafter, as shown in FIG. 1B, a region of a silicon wafer of the insulation film pattern 2 is etched using a KOH aqueous solution in an orientation dependent etching method so as to form a pyramid-shaped hole 3 having a very sharp top.

In addition, as shown in FIG. 1C, a tip 4 is formed, and the silicon wafer 1 and the insulation film pattern 2 are removed to expose a tip 4 which is made of only the tip material.

Thereafter, as shown in FIG. 1D, a gate insulation film 5 and a gate electrode 6 are deposited on the tip 4 in order, and etched by a photo-etching process so as to form a field emission display device.

Next, the method of M. Nakamoto et. al. will now be explained. The method thereof has the same processes as the processes shown in FIGS. 1A through 1C. That is, the method of M. Nakamoto et al. is directed to transferring a tip from a silicon substrate to a glass substrate by bonding a top region of the tip 4 and a glass substrate 7 by an electrostatic thermal bonding method.

Here, the electrostatic thermal bonding method denotes bonding two materials using a high electron field formed on a boundary by applying a proper heat and a direct current voltage thereto after making a conjunction between a metal or a semiconductor and a glass.

Thereafter, the mold silicon substrate 1 is removed by a moisture etching, the gate insulation film 5 and the gate electrode 6 are formed on the tip 4 and patterned by a photo-etching process to form a field emission display device.

Next, the field emission display device fabricated in the method of M. Sokolich et al. is directed to using the substrate as a tip material formed by the deposition. In addition, the transfer mold technique is directed to forming a field emission display device on a glass substrate, thus achieving a more stable operation and a recommended standard environment.

As described above, when fabricating a field emission display device in the silicon mold method, it is possible to achieve the above-mentioned desired advantages.

That is, by varying the regional surface to be etched, it is possible to select a desired bottom surface of the tip, the height thereof, and in addition, various kinds of geometrical configurations can be obtained. Moreover, a reproducible field emission display array can be obtained, and a wide range of the tip material is available.

SUMMARY OF THE INVENTION

Accordingly, it is an object of the present invention to provide a field emission display device fabrication method, which overcomes the problems encountered in a conventional field emission display device fabrication method.

It is another object of the present invention to provide an improved field emission display device fabrication method which adopts both a silicon wafer direct bonding method and a mold method so as to fabricate an improved field emission display device.

To achieve the above objects, in accordance with a first embodiment of the present invention, there is provided a field emission display device fabrication method, which includes the steps of a first step which forms a tip array by a molding method; and a second step which bonds the tip array to a second semiconductor substrate.

To achieve the above objects, in accordance with a second embodiment of the present invention, there is provided a field emission display device fabrication method, which includes the steps of (19) step which forms a mold by etching a first semiconductor substrate in an orientation dependent etching method; (20) step which forms a silicon nitride film on a substrate of the mold; (21) step which deposits an insulation film on a region except the region of an upper portion of the silicon nitride film by a thermal oxide process; (22) step which forms a tip array on the silicon nitride film within the mold; (23) step which removes the first semiconductor substrate after bonding a second semiconductor substrate on the insulation film and the tip array; and (24) step which etches to exposures an end portion of the tip array after depositing a gate electrode metal.

DETAILED DESCRIPTION OF THE INVENTION

To begin with, the present invention is directed to fabricating a field emission display device having a tip formed by a transfer mold technique on a substrate in a silicon wafer direct bonding method.

Referring to FIGS. 2A through 2I, the fabrication method of a field emission display device of a first embodiment according to the present invention will now be explained.

Figure 1A:
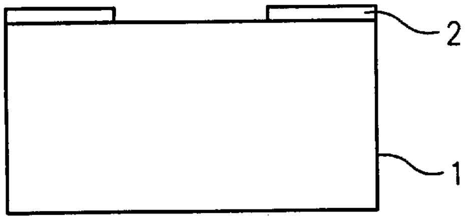
FIG. 1A CONVENTIONAL ART
FIGS. 1A through 1E are cross-sectional views of a field emission display device so as to show a conventional field emission display device fabrication process in accordance with a mold method.
Figure 1B:
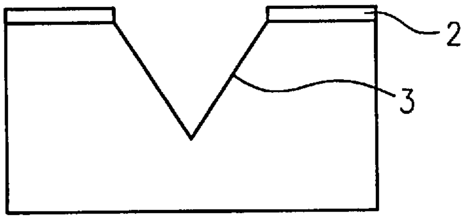
FIG. 1B CONVENTIONAL ART
Figure 1C:
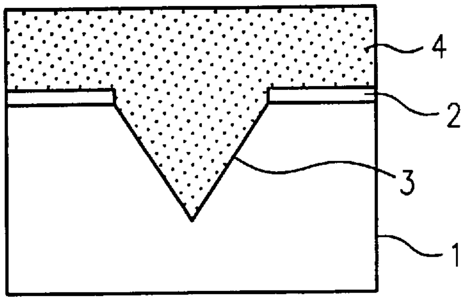
FIG. 1C CONVENTIONAL ART
Figure 1D:
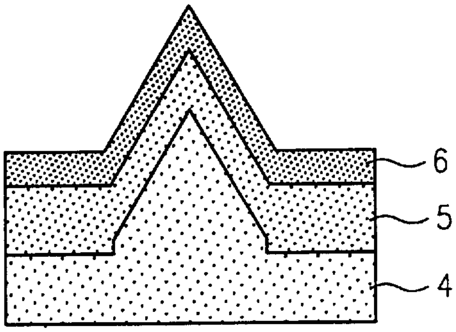
FIG. 1D CONVENTIONAL ART
Figure 1E:
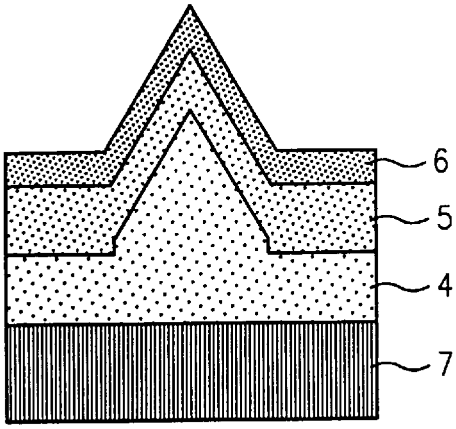
FIG. 1E CONVENTIONAL ART
Figure 2A:
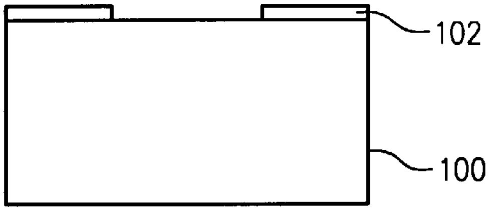
FIGS. 2A through 2I are cross-sectional views of a field emission display device so as to show a field emission display device fabrication process in a silicon wafer direct bonding method of a first embodiment according to the present invention.
Figure 2B:
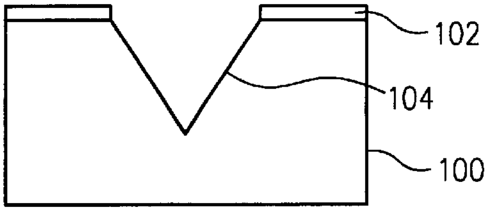

A thermal oxide film which is used as an etching mask 102 on a first silicon substrate 100, and as shown in FIG. 2A, is patterned by a photo etching process. Thereafter, as shown in FIG. 2B, the first silicon substrate 100 is etched by a KOH aqueous solution so as to form a pyramid-shaped hole 104.

Figure 2C:
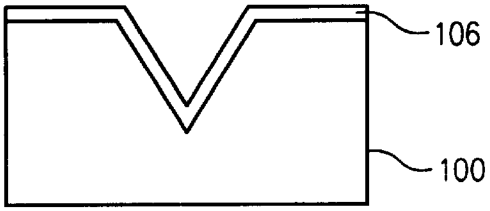

Thereafter, as shown in FIG. 2C, the thermal oxide film, which is used for an etching mask 102, and a first thermal oxide film 106 are formed on the entire surface of the first silicon substrate 100 including the pyramid-shaped hole 104. At this time, in case of removing the silicon mold in a moisture etching method, the first thermal oxide film 106 acts as an etch stopping layer and as a part of a gate insulation film.

Figure 2D:
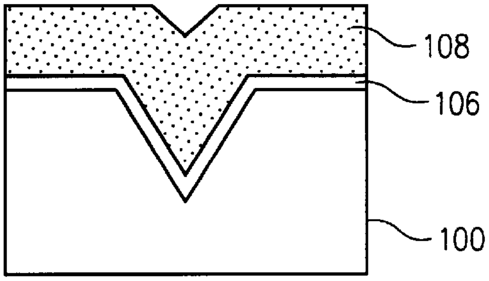

Next, as shown in FIG. 2D, a tip material 108 is deposited on the first thermal film 106 of the first silicon substrate 100. At this time, as the tip material, a poly-crystal silicon, a tungsten, a metal or a semiconductor material which are obtained in a CVD method, a sputtering method, or an evaporation method, and a metal material obtained by an electro-plating or an electroless plating.

Figure 2E:
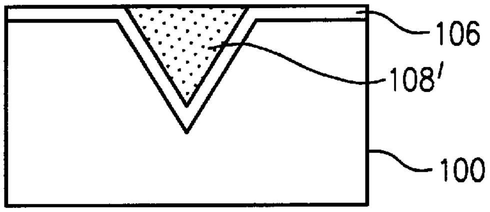

As shown in FIG. 2E, a predetermined region except the region of the tip material is removed in a moisture etching method, a dry etching method, or a mechanical lapping and polishing so as to form a pyramid-shaped tip array 108'.

Figure 2F:
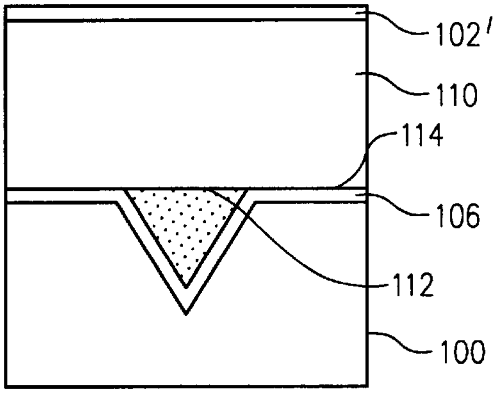

Next, as shown in FIG. 2F, the surface of the first thermal oxide film 106 and the tip array 108' should be made to come into contact with a second silicon substrate plate 110 in a direct conjunction method. Here, the direct conjunction method denotes a method of making a conjunction between more than two materials by chemical or thermal treatments without using a certain medium. The detailed description about the direct conjunction method above will be provided in the third process below.

That is, the surface bonded in a first step is washed and chemically treated so as to hydrophilize the surface, and the two surfaces come into contact with each other at a room temperature in a second step, and an initial bonding is performed in a hydrogen bonding method, and the two substrates are annealed at a temperature of 800 through 1200° C. for 30 through 120 minutes.

When the two materials are bonded, the first thermal oxide film 106 and a boundary 114 of the second silicon substrate 110 are connected by a direct conjunction, and the tip array 108' and a boundary 112 of the second silicon substrate 110 can be also connected by a direct conjunction, and in case that the tip material is metal, they can be connected by an eutectic bonding, a silicide formation, or a metal bonding in vacuum.

In addition, when a pyrex film formed in a sputtering method or a $SiO_2$ is inserted between two silicon substrates, there may happen a static thermal conjunction therebetween. In this case, the tip array may be transferred to a silicon substrate, not to a glass substrate.

Figure 2G:
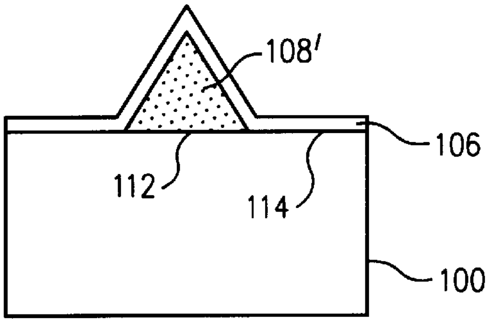

Next, as shown in FIG. 2G, the first silicon substrate 100 can be removed in a silicon etching method by inserting the pattern into an orientation dependent etching solution, which has a certain etching rate with respect to the oxide film 106 compared with a silicon substrate, such as an EPW solution, a KOH aqueous solution, or a $N_2H_4$ aqueous solution.

At this time, since the annealing with respect to the second silicon substrate 110 is performed under an oxygen environment, the second silicon substrate 110 can be free from an etchant because an oxide film 102' is formed on the lower surface of the substrate, an insulation film $Si_3N_4$, $SiO_2$, etc. are deposited on the lower surface of the substrate in a sputtering method, or an etching mask 102' is formed by covering an apizon wax.

Figure 2H:
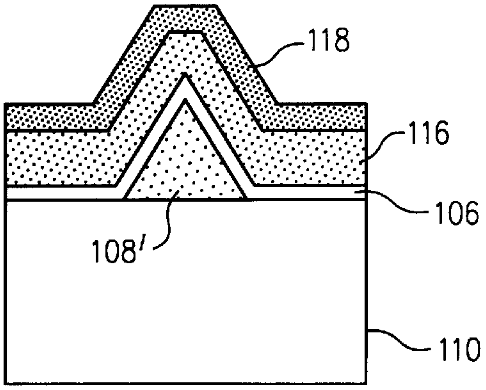

After the silicon substrate is substantially removed, as shown in FIG. 2H, only the first thermal oxide film 102 is used as a gate insulation film, or the thick gate insulation film 116 is deposited on the first thermal oxide film 102, and the gate electrode metal 118 is deposited thereon in order.

Figure 2I:
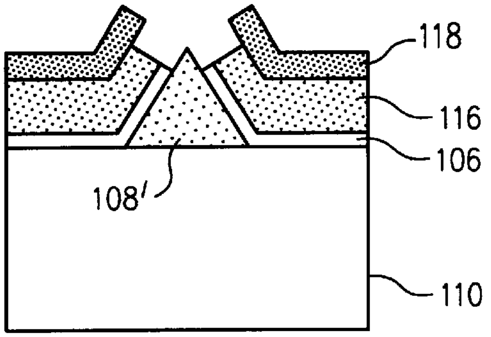

Finally, the first thermal oxide film 106, the gate insulation film 116, and the gate electrode 118 are patterned in a photo-etching process as shown in FIG. 2I, and a field emission display device is fabricated.

Next, a field emission display device fabrication method of a second embodiment according to the present invention will now be explained with reference to FIGS. 3A through 3D.

Figure 3A:
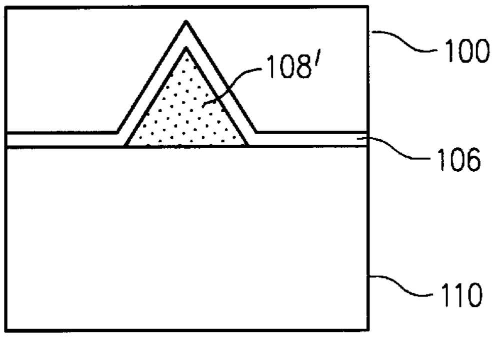
FIGS. 3A through 3D are cross-sectional views of a field emission display device so as to show a field emission display device fabrication process in a silicon wafer direct bonding method of a second embodiment according to the present invention.

To begin with, since the pattern of FIG. 3A is fabricated in the previously-mentioned method shown in FIG. 2A through 2E, the description thereof will be omitted.

The first thermal oxide film 106 and the tip material 108' are bonded with the second silicon substrate 110, and a patterning with respect to the silicon substrate 100 is performed to expose a predetermined region of a silicon, so that the pattern is formed as shown FIG. 3A.

At this time, the thickness of the remaining first silicon substrate 100 can be changed in a predetermined method such as a mechanical lapping method, a chemical etching method, a highly boron-doped layer, a method of using a highly boron-doped layer or a buried oxide layer, or an electrochemical automatic etch-stopping method, so that the first silicon substrate 100 can be of a very flat and thin type.

Figure 3B:
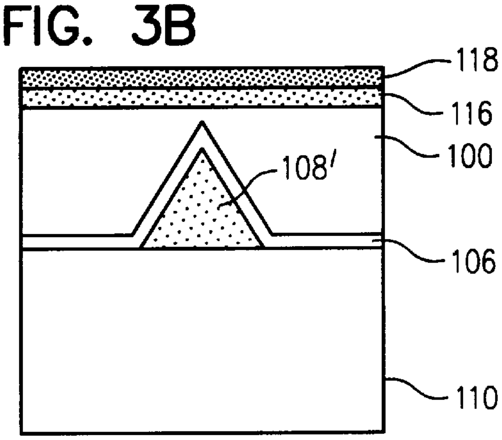
Figure 3C:
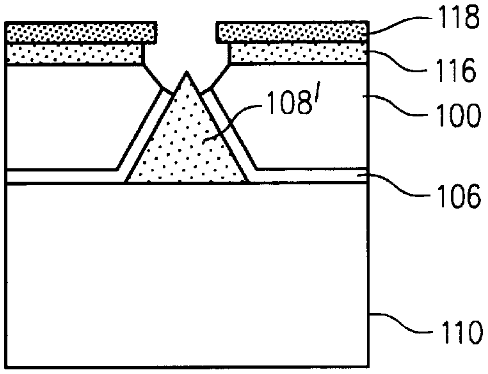

As shown in FIG. 3B, the gate insulation film 116 and the gate electrode metal 118 are deposited in order, and the first thermal oxide film 106, the gate insulation film 118, and the gate electrode metal 118, as shown in FIG. 3C, are patterned by a photo-etching process to form a field emission display device having a substrate of a silicon wafer.

Figure 3D:
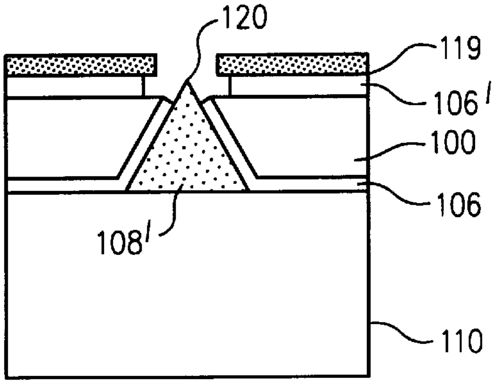

Meanwhile, in order to enhance a field emission display device characteristic, if arraying the end of the tip array 108' is necessary at the lower surface 119 of the gate electrode, as shown in FIG. 3D, the thin first silicon substrate 110 can be annealed with respect to the surface by a predetermined depth of the thickness thereof. At this time, the thusly grown second thermal oxide film 106' can be used as a gate insulation film.

As described above, the second embodiment of the present invention is directed to partially removing the first silicon substrate, thus implementing the next process on the substantially flat surface. In case that the tip array 108' formed by a molding has a relatively high step, the above-mentioned embodiment can be adopted very usefully.

That is, when the height of the tip 108' exceeds a predetermined level, for example about over 2 $\mu$m, the thickness of the gate insulation film should become thick, thus decreasing the flatness level, so that there may be a predetermined interference with respect to corresponding processes. In this case, it is needed to maintain the silicon substrate higher than the tip 108', thus decreasing a difficult process.

Next, a field emission display device fabrication method of a third embodiment according to the present invention will now be explained with reference to FIGS. 4A through 4D.

To begin with, the third embodiment of the present invention is directed to providing a second thermal oxide film 106' as a gate insulation film forming by thermal-oxidizing the silicon mold by a predetermined thickness in a moisture etching process. Since the processes before the process of FIG. 4A is the same as the second embodiment, the same description with respect thereto will be omitted.

Figure 4A:
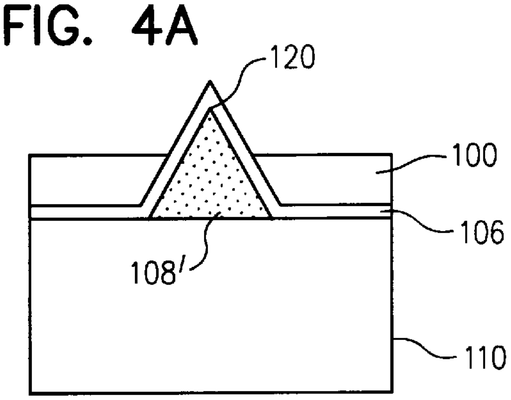
FIGS. 4A through 4D are cross-sectional views of a field emission display device so as to show a field emission display device fabrication process in a silicon wafer direct bonding method of a third embodiment according to the present invention.

As shown in FIG. 4A, it is needed to remove a predetermined part of the first silicon substrate 100 so as to obtain a thinner thickness compared with the occasion of FIG. 3A. That is, it can be achieved by etching the first silicon substrate 100 to substantially expose an end portion of the tip array 120.

At this time, the remaining substrate thickness should be determined in accordance with a certain simulation so that the thickness of the thermal oxide film can match to the end 120 of the tip array.

That is, a part of the silicon substrate 100 remained by the thermal oxide process should be substantially changed to the second oxide film 106', and the thickness of the silicon substrate 100 should be determined so that the height of an upper portion of the second thermal oxide film 106' can match to the end 120 of the tip array 120, or should be lower than that of the end 120.

Figure 4B:
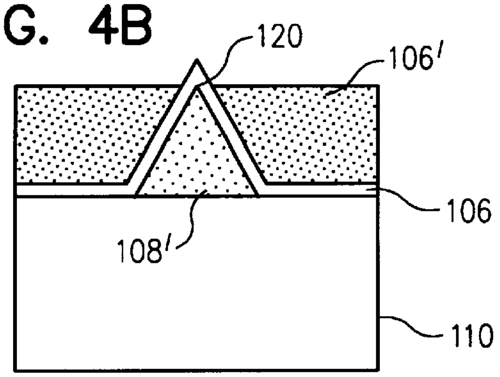

Thereafter, the first silicon substrate 100 is oxide-annealed so as to form the second thermal oxide film 106' as shown in FIG. 4B.

Figure 4C:
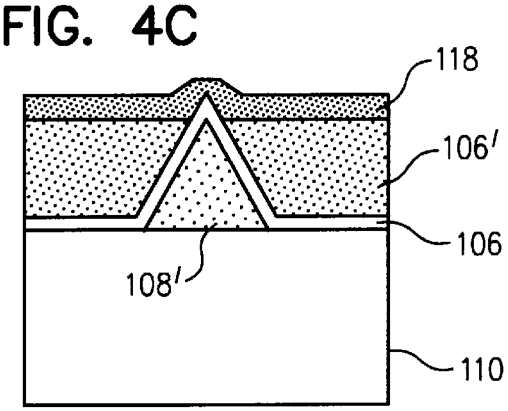
Figure 4D:
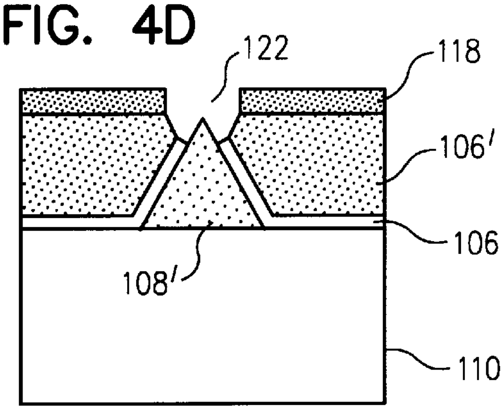

Next, as shown in FIG. 4C, the gate electrode metal 118 is deposited on the first thermal oxide film 106 of the end portion 120 of the tip array and both ends of the second thermal oxide film 106', and as shown in FIG. 4D, the gate metal, the second thermal oxide film 106' and the first thermal oxide film 106 are selectively etched by a photo-etching process so as to expose the end portion of the tip.

As a result, the tip 108' is formed to expose a central portion of the gate hole 122.

A field emission display device fabrication method of a fourth embodiment according to the present invention will now be explained with reference to FIGS. 5A through 5J.

To begin with, the fourth embodiment of the present invention is directed to executing a molding process after the first thermal oxide film is deposited in an attempt to prevent any damage with respect to the tip array or its chemical property.

Figure 5A:
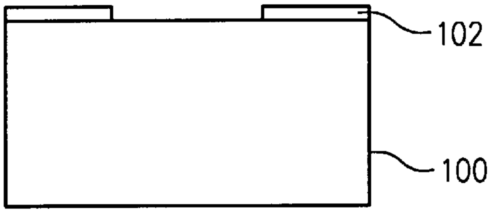
FIGS. 5A through 5J are cross-sectional views of a field emission display device so as to show a field emission display device fabrication process in a silicon wafer direct bonding method of a fourth embodiment according to the present invention.
Figure 5B:
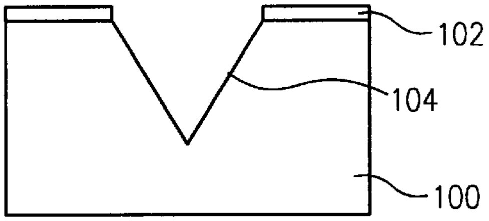

As shown in FIG. 5A, an etching mask 102 of a pattern is formed on the first silicon substrate 100, and the silicon substrate 100 is etched by an orientation dependent etchant, and as shown in FIG. 5B, a pyramid-shaped hole 104 is formed.

Figure 5C:
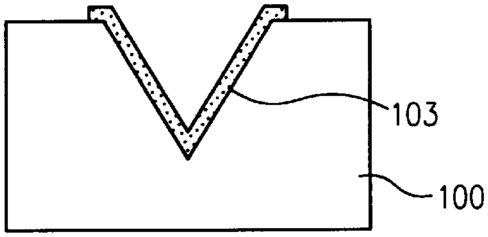

Thereafter, the etching mask 102 is removed, and a silicon nitride film 103 of $Si_3N_4$ is deposited in a CVD method or a sputtering method so that the first thermal film can be selectively deposited by a local oxidation method of a silicon LOCOS, and as shown in FIG. 5C, the silicon nitride film 103 thereof is patterned so that the periphery of the mold can be left.

Figure 5D:
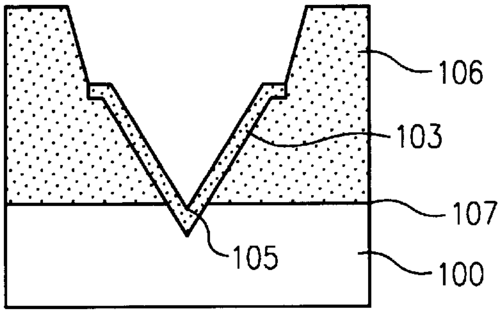

Next, as shown in FIG. 5D, the first thermal oxide film 106 is deposited at the region except the region of the nitride film 103 by a thermal oxide process with respect to the first silicon substrate 100. At this time, the lower portion 107 of the first thermal oxide film 106 is arrayed with respect to the end portion of the mold in accordance with a possible variation of the oxidizing process obtained by a process simulation.

Figure 5E:
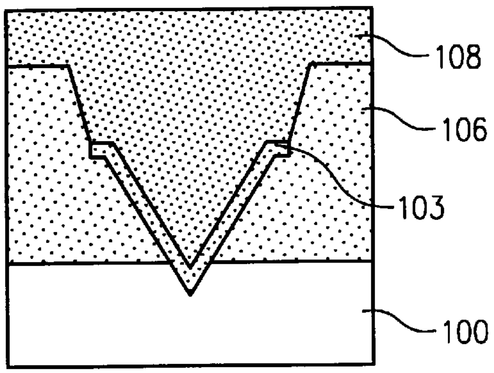
Figure 5F:
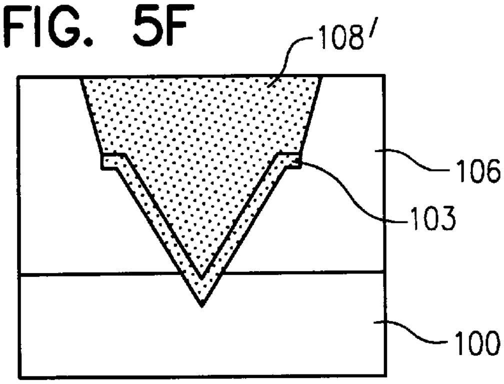

That is, as shown in FIG. 5E, the tip material 108 is deposited on the nitride film 103 and the side and upper portion of the first thermal oxide film 106, respectively, the region except the region of the tip material is removed by a moisture etching, a dry etching, a mechanical lapping or a polishing, thus forming a tip array 108' as shown in FIG. 5F.

Figure 5G:
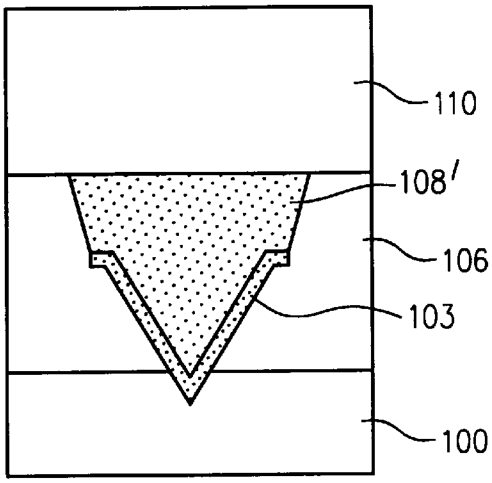
Figure 5H:
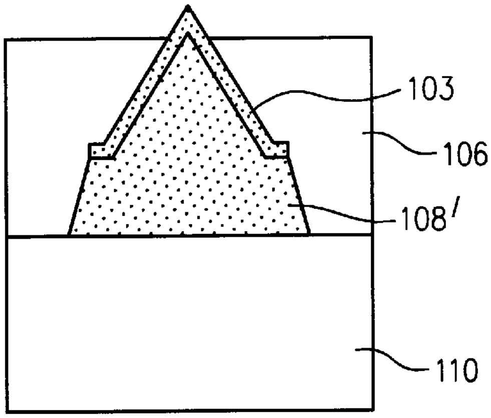

In addition, as shown in FIG. 5G, the second silicon substrate 110 is bonded to the surfaces of the tip array 108' and the first thermal oxide film 106, and the first silicon substrate 100 adopted as a mold is substantially removed as shown in FIG. 5H using the first thermal oxide film 106 as an etching stop mask.

Figure 5I:
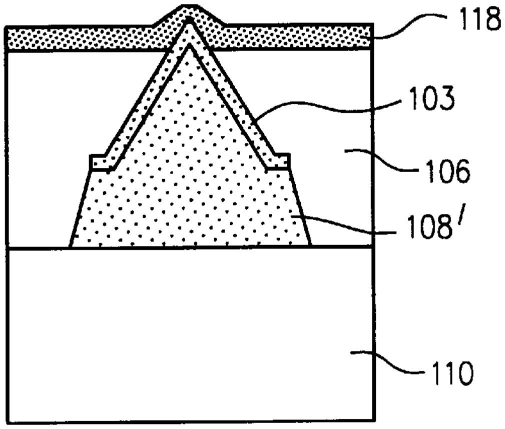
Figure 5J:
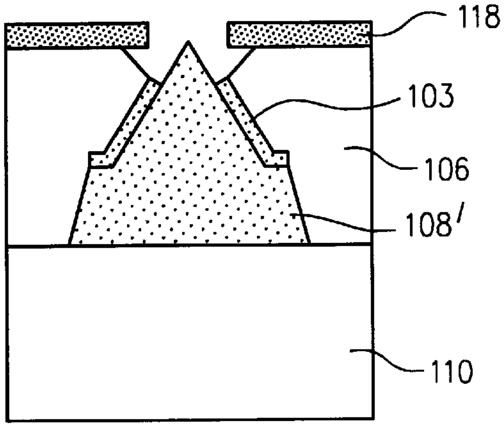

Thereafter, as shown in FIG. 5I, the gate electrode metal 118 is deposited on the nitride film 103 of the end portion of the tip array and the first thermal oxide film 106, and the gate metal 118, the nitride film 103, and the first thermal oxide film 106 are selectively removed by a photo-etching process so as to fabricate a field emission display device as shown in FIG. 5J.

As described above, the field emission display device fabrication method has advantages in that 1) the mold substrate and the substrate used as foundation of a tip array are made of the same material such as a homogenous crystal silicon and have a good compatibility with the VLSI technique, 2) it is possible to perform necessary processes irrespective of its step coverage because a photo-etching process and its next necessary process such as gate insulation film and gate electrode patterning processes on a substantial flat surface of the semiconductor, and 3) a field emission display device having a high reliability can be fabricated by using a quality thermal oxide film as a gate insulation film.

What is claimed is:

1. A field emission display device fabrication method, comprising the steps of:

(1) forming a tip by a molding method, the molding method comprising the steps of (2) forming a mold by an etching process after forming an etching mask on a first semiconductor;

(3) forming an insulation film on a surface of said first semiconductor substrate on which said mold is formed;

(4) forming a tip on said insulation film on which the mold is formed using moisture etching, dry etching, or a mechanical lapping and polishing method;

(5) bonding said tip to a second silicon semiconductor substrate, the bonding method comprising the step of:

(6) hydrophilizing a surface to be bonded in a chemical treatment after washing said surface;

(7) performing a first bonding in a hydroconjunction method after contacting two surfaces of substrates at room temperature; and (8) annealing two substrates at 800 to 1200° C.

2. The method of claim 1, wherein said tip is formed using one of a poly-crystal silicon, a tungsten, and metals and semiconductor materials obtained by a CVD, sputtering and evaporation methods, wherein the metals are obtained by an electro-plating or an electroless plating.

3. The method of claim 1, wherein said (5) step is executed by one of the methods of a melting bond, a silicide formation bond, or a metal bond in vacuum when the tip is metal.

4. The method of claim 1, wherein said (5) step is directed to being executed in an electro-static thermal bond method after forming a pyrex film or an oxide film on a surface to be bonded in a sputtering method.

5. The method of claim 1, wherein said fabrication method further includes the steps of:

(9) etching the first semiconductor substrate, used as the mold, after bonding the second silicon semiconductor substrate on the tip; and

(10) etching so as to expose a top of the tip after depositing a gate insulation film and a gate electrode metal on a remaining region of the first semiconductor substrate.

6. The method of claim 5, wherein said first semiconductor substrate is directed to being etched by one of the methods of a chemical etching method, a method of using an etching stop layer by forming a high density boron spreading layer or a buried oxide layer within the first semiconductor substrate, and an electrochemical automatic etch-stopping method.

7. The method of claim 5, wherein said first semiconductor substrate is etched so that the insulation film formed on the tip is not exposed.

8. The method of claim 1, wherein said fabrication method further includes the steps of:

(11) etching the first semiconductor substrate, used as the mold, after bonding the second silicon semiconductor substrate with the tip;

(12) thermal-oxidizing a remaining region of the first semiconductor substrate; and

(13) etching selectively so that a top of the tip is exposed after depositing a gate electrode metal.

9. The method of claim 8, wherein said first semiconductor substrate is etched to expose the top of the tip.

10. The method of claim 9, wherein a surface of the remaining region of said first semiconductor substrate is thermal-oxidized in case that the first semiconductor substrate is etched to become thin so that the top of the tip is exposed.

11. The method of claim 8, wherein said first semiconductor substrate is etched not to expose the insulation film and the tip.

12. The method of claim 11, wherein a surface of the remaining region of said first semiconductor substrate is thermal-oxidized in case that the first semiconductor substrate is etched to become thin so that the insulation and the tip are not exposed.

13. The method of claim 8, wherein a thickness of said first semiconductor substrate is varied to permit a thickness of a thermal oxide film to be matched to an end portion of the tip or to be lower than that of the end portion thereof.

14. The method of claim 1, wherein said fabricating method further includes the steps of:

(14) removing the first semiconductor substrate after bonding the second silicon semiconductor substrate to surfaces of the insulation film and the tip [array]; and

(15) etching selectively after depositing a gate electrode metal on the insulation film.

15. The method of claim 14 wherein said first semiconductor substrate is etched by etchant having a lower the insulate with respect to the insulation film compared with the first semiconductor substrate.

16. The method of claim 14, further including one of the steps of: (16) depositing an oxide film on said silicon second semiconductor substrate by annealing in an oxygen environment during a bonding process or (17) depositing an insulation film or apizon wax on the back side of the second semiconductor substrate.

17. The method of claim 14, wherein said fabrication method further includes (18) step which forms a gate insulation film on the insulation film.

18. A field emission display device fabricating method, comprising the steps of:

(19) forming a mold by etching a first semiconductor substrate;

(20) forming a silicon nitride film on a substrate on said mold;

(21) depositing an insulation film on the substrate but not on said silicon nitride film by a thermal oxide process;

(22) forming a tip on the silicon nitride film within the mold;

(23) removing said first semiconductor substrate after bonding a second silicon semiconductor substrate to surfaces on the insulation film and the tip; and

(24) etching to expose an end portion of the tip after depositing a gate electrode metal.

19. The method of claim 18, wherein said tip is formed using one of poly-crystal silicon, a tungsten, and metals and semiconductor materials obtained by a CVD, sputtering and evaporation methods, and wherein the metals are obtained by an electro-plating or an electroless plating.

20. The method of claim 18, wherein said (23) step includes the steps of:

(25) hydrophilizing a surface using a chemical treatment after washing the surface to be bonded;

(26) performing a first bonding in a hydro-conjunction method after contacting two surfaces of substrates at a room temperature; and

(27) annealing two substrates at 800 to 1200° C.

21. The method of claim 18, wherein said (23) step is executed by one of the methods of a melting bond, a silicide formation bond, a metal bond in vacuum in case that the tip is metal.

22. The method of claim 18, wherein said (23) step is directed to being executed by an electrostatic thermal bond method after forming a pyrex film or an oxide film on a surface to be bonded in a sputtering method.

* * * * *